US009065391B1

(12) United States Patent
Komiak (10) Patent No.: US 9,065,391 B1
(45) Date of Patent: Jun. 23, 2015

(54) METHOD OF OPERATING A POWER AMPLIFIER IN CLASS F/INVERSE CLASS F

(71) Applicant: BAE Systems Information And Electronic Systems Integration Inc., Nashua, NH (US)

(72) Inventor: James J. Komiak, Merrimack, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 58 days.

(21) Appl. No.: 14/028,638

(22) Filed: Sep. 17, 2013

Related U.S. Application Data

(60) Provisional application No. 61/701,892, filed on Sep. 17, 2012.

(51) Int. Cl.
*H03F 3/191* (2006.01)
*H03F 3/193* (2006.01)

(52) U.S. Cl.
CPC ............... *H03F 3/193* (2013.01); *H03F 3/191* (2013.01)

(58) Field of Classification Search
CPC ....................................................... H03F 3/191

USPC .................................. 330/302, 305, 306, 307
See application file for complete search history.

(56) References Cited

U.S. PATENT DOCUMENTS

| 4,901,032 | A | 2/1990 | Komiak | |
|---|---|---|---|---|
| 7,176,769 | B1 * | 2/2007 | Ellis | ............................. 333/125 |
| 2009/0039966 | A1 * | 2/2009 | Chow et al. | .................. 330/307 |
| 2011/0081873 | A1 * | 4/2011 | Akasegawa | ..................... 455/83 |

* cited by examiner

*Primary Examiner* — Steven J Mottola
(74) *Attorney, Agent, or Firm* — Sand & Sebolt; Daniel J. Long (57) ABSTRACT

A system and method for amplifying and wave shaping a signal is presented. A system includes a Class F/Inverse Class F radio frequency (RF) power amplifier (PA). The RF PA includes an amplifier and an output matching network. The amplifier amplifies a radio wave signal to produce and an amplified signal. The output matching network wave shapes the amplified signal using a plurality of tuning stubs to generate an output signal. The tuning stubs operate at different harmonics of the amplified signal. When operating in a Class F mode the plurality of tuning stubs act as short circuits at even harmonics and the plurality of tuning stubs act as open circuits at odd harmonics. When operating in an Inverse Class F mode the plurality of tuning stubs act as open circuits and at even harmonics the plurality of tuning stubs act as short circuits at odd harmonics.

17 Claims, 6 Drawing Sheets

METHOD OF OPERATING A POWER AMPLIFIER IN CLASS F/INVERSE CLASS F

CROSS REFERENCE TO RELATED APPLICATION

This application claims priority from U.S. Provisional Application Ser. No. 61/701,892, filed Sep. 17, 2012; the disclosure of which is incorporated herein by reference.

BACKGROUND OF THE INVENTION

1. Field of Invention

The current invention relates generally to apparatus, systems and methods for amplifying a signal. More particularly, the apparatus, systems and methods relate to a power amplifier (PA). Specifically, the apparatus, systems and methods provide for a power amplifier that operates across at least an octave of bandwidth with high efficiency.

2. Description of Related Art

Amplifiers have long been used to amplify a variety of electrical signals. For example, amplifiers can be used to amplify voltage, current, power and the like. Early amplifiers used vacuum tubes to amplify signals. These tubes where large, used high power and often burned out. The invention of the silicon transistor greatly improved amplifier technology and quickly led to the extinction of vacuum tubes. Silicon transistors were much smaller, cheaper, could be more easily mass produced and had a much longer life span than vacuum tubes. Additionally, transistors consume much less power and generate less heat than vacuum tubes.

Because of a transistors small size, it has allowed for more sophisticated amplifiers to be designed. For example, operational amplifiers (Op Amps) contain two or more stages of amplification each with their own bias schemes all implemented with transistors and other discrete components. Op Amps provide excellent common mode rejection so that just a signal of interest is amplified.

Additionally prior art radio frequency (RF) amplifiers disclose various ways of doing harmonic wave shaping of voltage and current waveforms in a power amplifier to achieve high efficiency operation. Usually, these techniques use harmonic termination techniques to adjust waveforms to get the voltage and current in a proper quadrature alignment. This can provide for the maximum power output to occur at a minimum DC which provides high efficiency. Class F and inverse Class F are two of those matching modes. Historically, they have been used narrowband.

Even though there has been great progress in amplifier design, there is still need for amplifiers with enhanced efficiency, improved linearity, little to no phase change over a frequency range. Therefore, what is needed is a better radio frequency (RF) power amplifier across greater bandwidths.

SUMMARY

The preferred embodiment of the invention includes a Class F/Inverse Class F radio frequency (RF) power amplifier (PA). A key benefit of this RF PA is its compact implementation topology that allows for high efficiency Class F and inverse Class F operation over a wide bandwidth of at least an octave band as opposed to prior state of the art which only allowed 10% bandwidth. The RF PA includes an amplifier and an output matching network. The amplifier amplifies a radio wave signal to produce and an amplified signal. The output matching network wave shapes the amplified signal using a plurality of tuning stubs to generate an output signal. The tuning stubs operate at different harmonics of the amplified signal. When operating in a Class F mode the plurality of tuning stubs act as short circuits at even harmonics and the plurality of tuning stubs act as open circuits at odd harmonics. When operating in an Inverse Class F mode the plurality of tuning stubs act as open circuits at even harmonics the plurality of tuning stubs act as short circuits at odd harmonics.

Another configuration of the preferred embodiment is a wideband radio frequency RF PA. The RF PA includes an amplifier that amplifies a radio signal to generate an amplified RF signal with a fundamental frequency. An output matching network wave shapes the amplified radio signal over a least an octave of bandwidth to create a wave shaped RF output. The output matching network further includes four tuning stubs. The first tuning stub tunes the amplified RF output at the second harmonic of the fundamental frequency, the second tuning stub tunes the amplified RF output at the third harmonic of the fundamental frequency, the third tuning stub tunes the amplified RF output at the fourth harmonic of the fundamental frequency. The fourth tuning stub tunes the amplified RE output at the fifth harmonic of the fundamental frequency.

Another configuration of the preferred embodiment is a method 500 of Class F/Inverse Class F wideband amplification. The method begins by amplifying a signal to generate an amplified signal. The signal can be amplified by a dual stage amplifier or in another way as understood by one of ordinary skill in the art. The amplified signal is wave shaped with a plurality of tuning stubs to generate an output signal. In particular, the tuning stubs operate at different harmonics of the amplified signal. When operating in a Class F mode the plurality of tuning stubs act as short circuits at even harmonics and the plurality of tuning stubs act as open circuits at odd harmonics. When operating in an Inverse Class F mode the plurality of tuning stubs act as open circuits and at even harmonics the plurality of tuning stubs act as short circuits at odd harmonics.

BRIEF DESCRIPTION OF SEVERAL VIEWS OF THE DRAWINGS

One or more preferred embodiments that illustrate the best mode(s) are set forth in the drawings and in the following description. The appended claims particularly and distinctly point out and set forth the invention.

The accompanying drawings, which are incorporated in and constitute a part of the specification, illustrate various example methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

Similar numbers refer to similar parts throughout the drawings.

DETAILED DESCRIPTION

Figure 1:
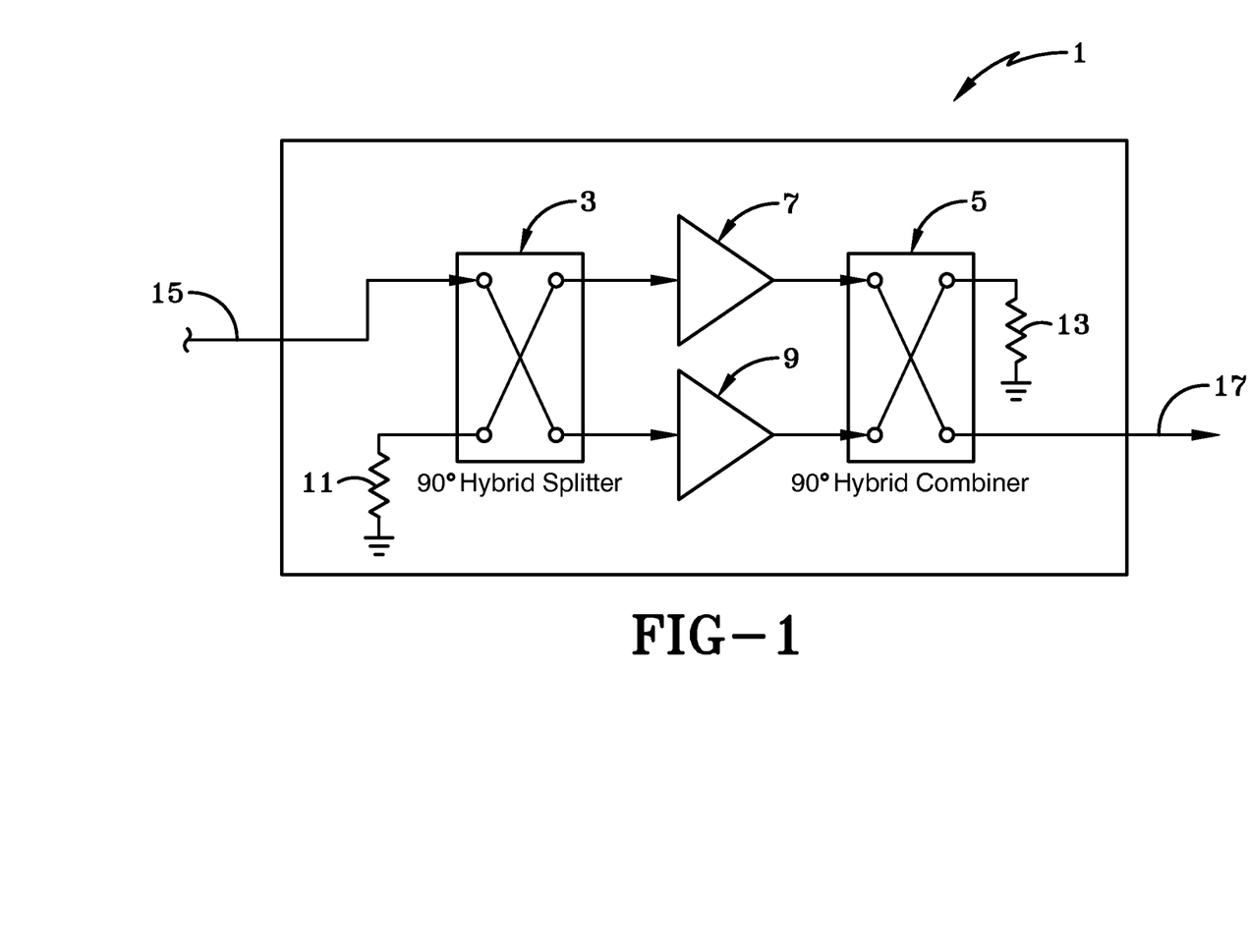
FIG. 1 illustrates an example schematic of a preferred embodiment of a Class F/Inverse Class F PA.

FIG. 1 illustrates the preferred embodiment of an example radio frequency (RE) power amplifier (PA) 1 that splits a signal two ways and amplifies that signal with two mirror identical halves of the PA 1. This example PA 1 includes a quadrature 90 degree Lange coupler 3 at its input and another similar Lange coupler 5 at its output. Dual state amplifiers 7, 9 are connected between the Lange couplers 3, 5 as illustrated and resistors 11, 13 connected the appropriate terminals of each Lange coupler 3, 5 to ground. An input line 15 receives radio frequency (RF) inputs that are to be amplified by the PA 1 before they are output on an output line 17.

An (RE) input is received on input line 15 and the first Lange coupler 3 splits the input two ways with each path 90 degrees out of phase with each other to create a balanced amplifier. A similar split occurs at the Lange coupler 5 at the output so that the output appears as a good impedance match to the outside world.

Figure 2:
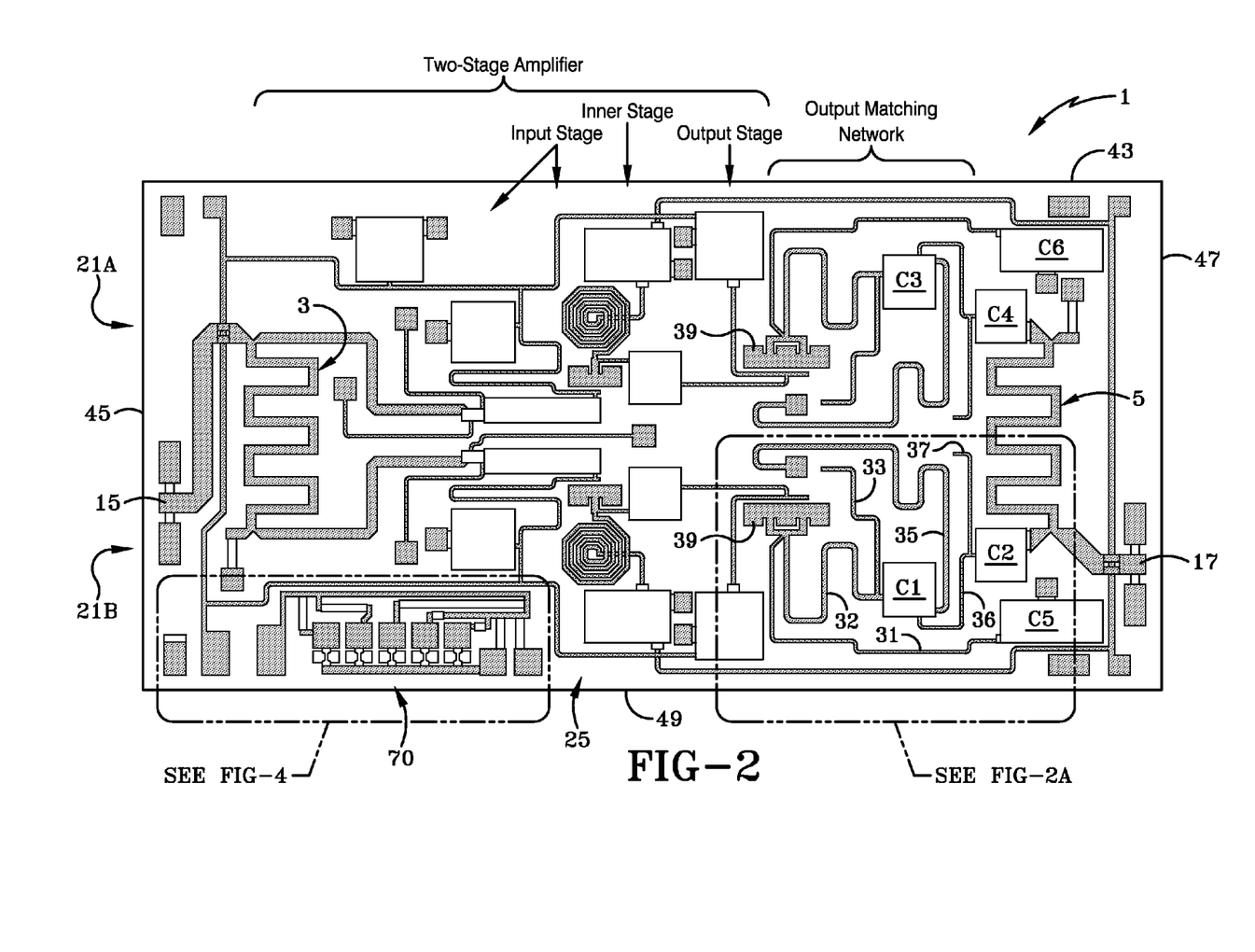
FIGS. 2 and 2A illustrate an example layout view of the preferred embodiment of a Class F/Inverse Class F PA.
Figure 2A:
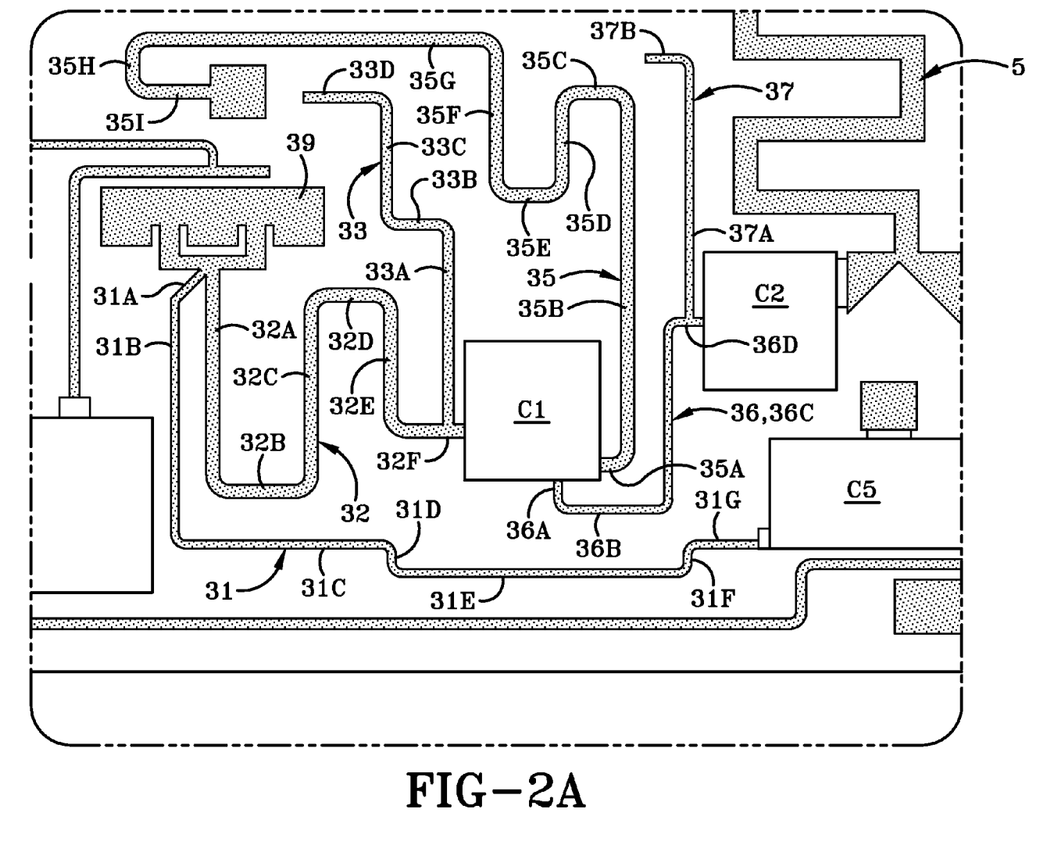

FIG. 2 illustrates the PA 1 illustrated in FIG. 1 with further details. As can be readily seen, the RF PA 1 is implemented on a chip as a two stage amplifier with to mirrored halves 21A, 21B. Because both halves 21A, 21B are essentially identical only one half is described but the description also applies to the other half. Each half of the RF PA 1 of FIG. 2 is a two-stage amplifier 25 that is a continuous Class F/Inverse Class F amplifier that provides a continuous phase angle shift. The RF PA 1 of FIG. 2 is an improvement over prior art amplifiers because it can continuously span (amplify) across at least four octaves. As will be discussed further below, the amplifier 1 when operating as Class F amplifier short circuits even harmonics and open circuits odd harmonics. The amplifier 1 when operating as Inverse Class F amplifier open circuits even harmonics and short circuits odd harmonics. This allows the RF PA 1 to wave shape the output signal that it is generating so the output current and voltage waveforms are in the correct quadrature. Thus the DC component is minimized to achieve high efficiency. Also, the squaring up of the waveforms puts more energy into the fundamental frequency.

As seen in FIG. 2 the folded Lange couplers 3, 5 are located at the input and output stages and are implemented as folded monolithic couplers.

As illustrated, they can be implemented with a meandering metal line. The lower left corner of FIG. 2 illustrates a "FRAP" device 70 this is discussed in more detail later with reference to FIG. 4. The input stage, inter stage and output stage of the two-stage amplifier 25 are generally indicated as labeled as shown in FIG. 2. These stages implement a typical two stage RF amplifier and the details of this two stage amplifier will not be further described here. The portion of the RF amplifier 1 that is of real interest is the output matching network that includes four tuning stubs 31, 33, 35, 37 that provide for a fifth-order amplifier that operates across the fundamental frequency, the second harmonic, the third harmonic, the fourth harmonic and the fifth harmonic in both Class F and Inverse Class F modes. Capacitors C1-C4 and other transformers provide the phase shift while the tuning stubs 31, 33, 35, 37 are shaping waves.

The first two tuning stubs 31, 33 are connected to an output transistor 39 of the two-stage amplifier 25. The first tuning stub 31 is a bias line that is A/C coupled to ground. This tuning stub 31 is implemented with meandering segments 31A-G of wire as illustrated. This tuning stub 31 acts as an open circuit at the fundamental frequency $f_1$ and a short circuit at the first second harmonic $f_{1-2}$, however, in the Inverse Class F amplifier mode the fundamental frequency $f_2$ is twice $f_1$ so that this stub appears as an open circuit at the second harmonic of $f_{2-2}$ (the first odd harmonic of $f_1$).

The second tuning stub 33 is open circuit tuning stub that for the first odd harmonic, $f_{1-3}$, appears as an open circuit. However, in the Inverse Class F mode of operation it appears as a short circuit at harmonic $f_{2-3}$. The third tuning stub 35 is a short circuit stub at the next harmonic even harmonic, $f_{1-4}$.

In the Inverse Class F mode of operation it is an open circuit for harmonic, $f_{2-4}$. Similarly, the fourth tuning stub 37 is an open circuit stub at the next harmonic odd harmonic, $f_{1-5}$ and in the Inverse Class F mode it is a short for odd harmonic, $f_{2-5}$.

Figure 3:
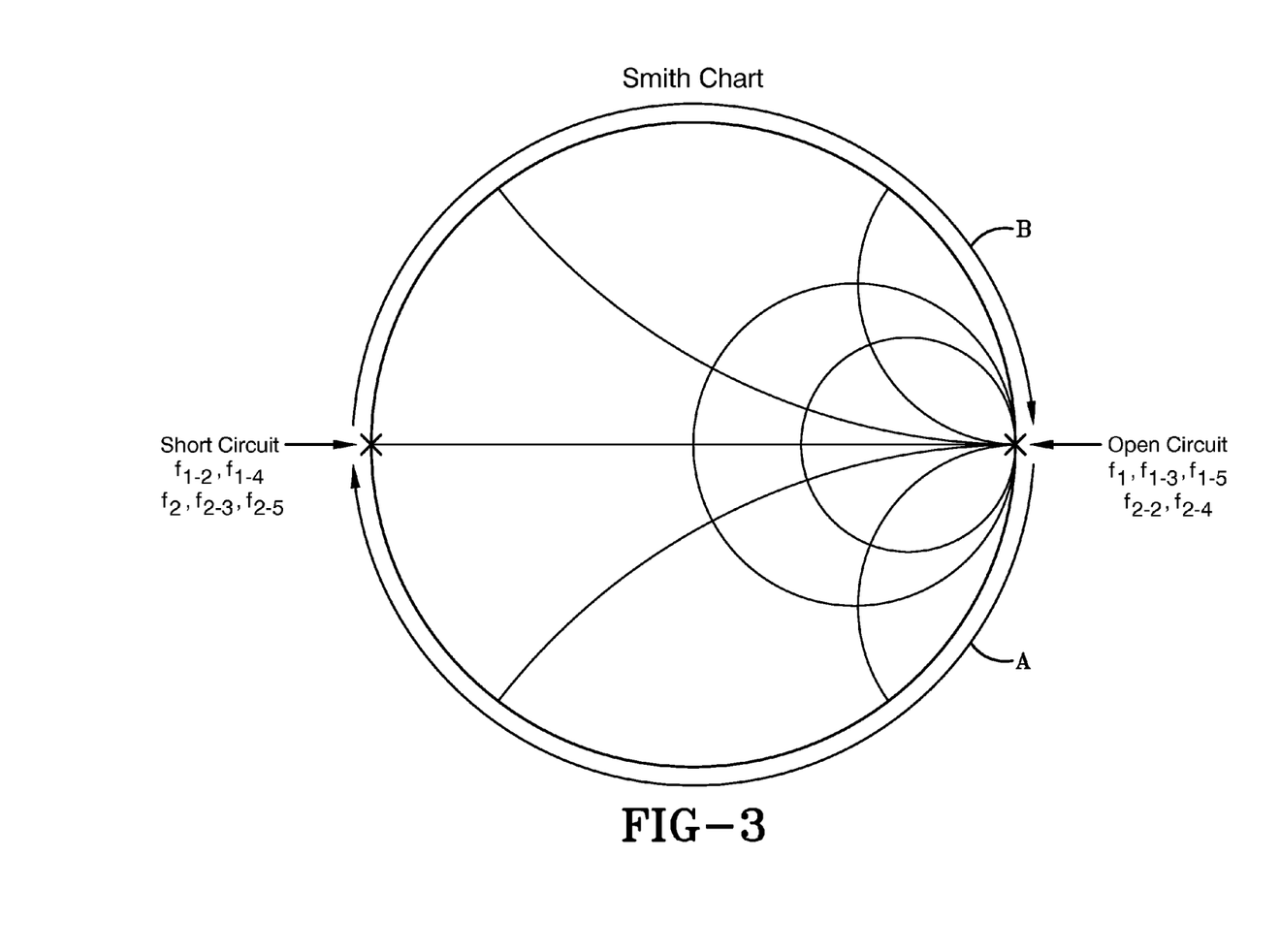
FIG. 3 illustrates an example Smith Chart highlighting the location of different harmonics on the Smith Chart.

FIG. 3 attempts to graphically illustrates the open/short and odd even switching between the harmonics of $f_1$/Class f and $f_2$/Inverse Class F. In summary, because the fundamental frequency of Inverse Class F is twice that of Class F itself, this means that Class F leads to shorted even harmonics and open odd harmonics while Inverse Class F lead to open even harmonics and shorted odd harmonics. To begin, $f_1$ begins at the "open circuit position" on the Smith Chart. As frequency increases the impedance moves along line A and the phase changes as the frequency moves along line A toward the "short circuit position" on the Smith Chart. When the second harmonic, $f_{1-2}$ of $f_1$ is reached, the first tuning stub 31 is acting as a short circuit at the short circuit position on the Smith Chart. As the frequency is further increased, the frequency moves along arrow B from the short circuit position toward the open circuit position. When the frequency is at the third (odd) harmonic, $f_{1-3}$, the open circuit position is reached and the second tuning stub 33 is now the dominant stub acting as an open circuit.

In the Inverse Class F mode $f_2$ is twice $f_1$ so that the fundamental frequency is located at short circuit position on the Smith Chart. Similar to the discussion above with respect to $f_1$ and the Class F mode of operation as the frequency is increased it travels along arrow B from the short circuit position toward the open circuit position until it is at the open circuit position at the first even harmonic, $f_{2-2}$. As the frequency is further increased it travels along arrow A from the open circuit position toward the short circuit position until it is at the short circuit position at the first odd harmonic, $f_{2-3}$. A similar explanation applies for harmonics $f_{1-4}$, $f_{1-5}$, $f_{2-4}$ and $f_{2-5}$.

The lengths and the spacing of the meandering tuning stubs 31, 33, 35 and 37 are important. It is important to space them far enough apart so that there is not any interference between them. As mentioned above, the first tuning stub 31 is formed with line segments 31A-G. With respect to a top edge 43, a left edge 45, a right edge 47 and a bottom edge 49 of the RF PA 1 the first line segment 31A of stub 31 points at about a 45 degree angle downward toward the bottom edge 49 and the left edge 45 from the transistor 39. In the preferred embodiment, the left edge 45 is parallel with the right edge 47 and the top edge 43 is parallel with the bottom edge 49 and all four edges form a rectangle shape. Line segment 31B extends downward from line segment 31A and is parallel to the left edge 45 and the right edge 47. Line segment 31C extends to the right of the downward end of line segment 31B and is parallel to the bottom edge 49. Line segment 31D forms a short downward "jog" from a right end of line segment 31C and is generally parallel with the left edge 45 and the right edge 47. Line segment 31E extends rightward from a bottom edge of line segment 31D and is parallel to the bottom edge 49. Line segment 31F forms a short upward "jog" from a right end of line segment 31E and is generally parallel with the left edge 45 and the right edge 47. Line segment 31G extends rightward from a top end of line segment 31F is parallel to the bottom edge 49 and terminates in a capacitor C5. In the preferred embodiment, the width of stub 31 is a constant fixed width and the stub 31 is formed in a metal layer.

Tuning stub 33 is formed with line segments 33A-D. It is connected to a transmission line 32 formed with line segments 32A-F. The transmission line 32 will be described first and then the details of the tuning stub 33 will be described. Transmission line segment 32A extends downward from transistor 39 and is generally parallel with the left edge 45 and the right edge 47. Line segment 32B extends rightward from a bottom end of line segment 32A and is generally parallel to the bottom edge 49. Line segment 32C extends upward from a right end of line segment 32B and is generally parallel with the left edge 45 and the right edge 47. Line segment 32D extends rightward from a top end of line segment 32C and is generally parallel to the bottom edge 49. Line segment 32E extends downward from a right end of line segment 32D and is generally parallel with the left edge 45 and the right edge 47. Line segment 32F extends rightward from a bottom end of line segment 32E and is generally parallel to the bottom edge. In the preferred embodiment, a right end of line segment 32F terminates in capacitor C1.

Tuning stub 33 line segment 33A extends upward from near the right end of line segment 32F of the transmission line 32 and is generally parallel with the left edge 45 and the right edge 47. Line segment 33B extends leftward from a top end of line segment 33A and is generally parallel to the bottom edge 49. Line segment 33C extends upward from a right end line segment 33B and is generally parallel with the left edge 45 and the right edge 47. Line segment 33D extends leftward of a top end of line segment 33C and is generally parallel to the bottom edge 49. In the preferred embodiment, line segments 32A-F of transmission line 32 are formed with a first width and line segments 33A-D of tuning stub 33 are formed with a second width that is larger than the first width. In the preferred embodiment, transmission line 32 and the tuning stub 33 are formed in a metal layer.

Tuning stub 35 is formed with line segments 35A-I. Line segment 35A is a short line segment that extends out of the right side of capacitor C1 and is parallel with the bottom edge 49. Line segment 35B extends upward from a right side of line segment 35A and is parallel with the right edge 47. Line segment 35C extends leftward out from a top end of line segment 35B and is parallel with the bottom edge 49. Line segment 35D extends downward from a left end of line segment 35C and is parallel with the right edge 47. Line segment 35E extends leftward out from a bottom end of line segment 35D and is parallel with the bottom edge 49. Line segment 35F extends upward from a left end of line segment 35E and is parallel with the right edge 47. Line segment 35G extends leftward from a top end of line segment 35F and is parallel to the bottom edge 49. Line segment 35H extends downward from line segment 35G and is parallel to the right edge 47. Line segment 35I extends rightward from a bottom end of line segment 35H and is parallel to the bottom edge 49. In the preferred embodiment, the widths of the lines segments 35A-I are the same and are formed in a metal layer.

Tuning stub 37 is formed with line segments 37A-B and is attached to a transmission line 36 formed with line segments 36A-D. Line segment 36A is a short line segment that extends downward out of the right side of capacitor C1 and is parallel with the right edge 47. Line segment 36B extends rightward out of a lower end of line segment 36A and is parallel with the bottom edge 49. Line segment 36C extends upward from a right end of line segment 36B and is parallel with the right edge 47. Line segment 36D extends rightward out of an upper end of line segment 36C with its right end connected to capacitor C1. Line segment 37A of tuning stub 37 extends upward from a center portion of line segment 36D of transmission line 36 and is parallel with the right edge 47. Line segment 37B extends leftward from a top end of line segment 37A and is parallel with the bottom edge 49.

Figure 4:
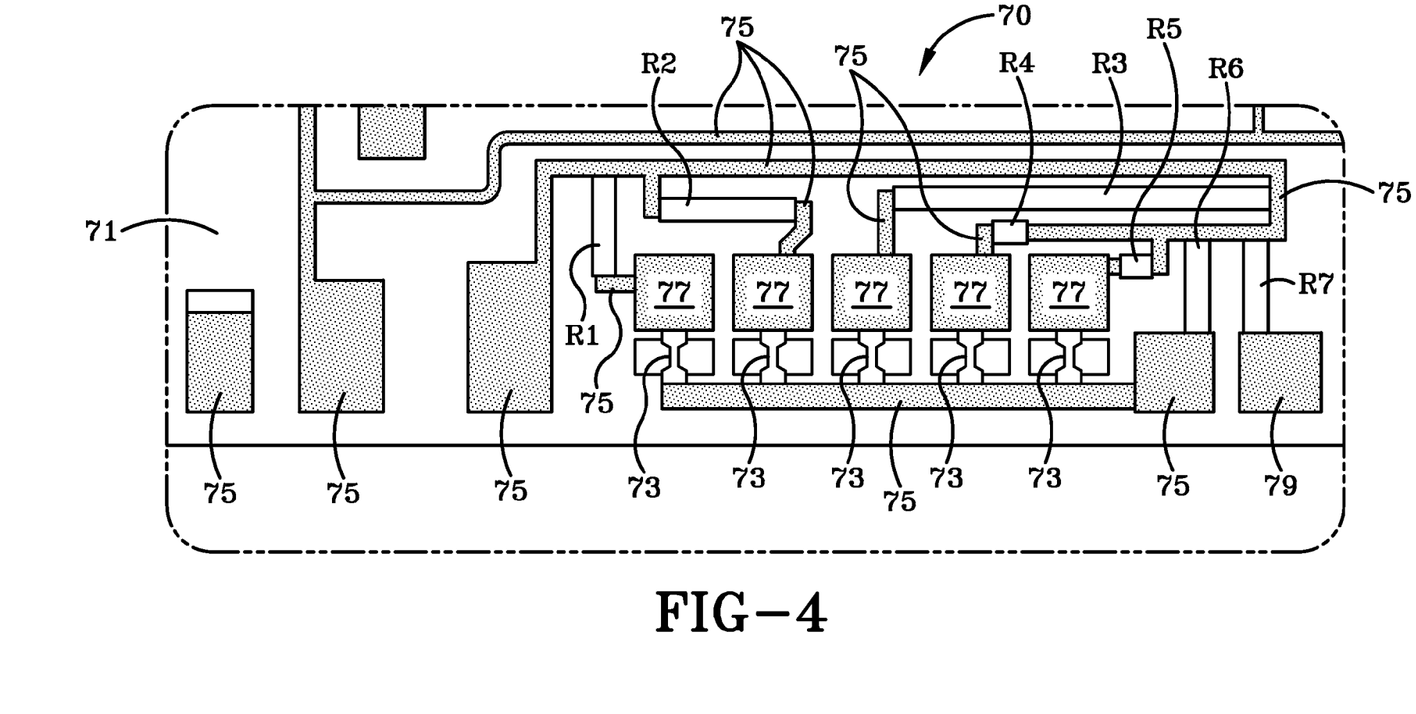
FIG. 4 illustrates an example layout view of a "FRAP" circuit.

FIG. 4 illustrates the details of the fusible link resistive voltage divider "FRAP" device 70. This device is used to adjust the bias point of biasing circuits at the time of wafer testing. In the preferred embodiment, the FRAP 70 is on a GaN wafer 71 with conductive electrical routing and pad components. Five resistors R1-5 are provided and are connected to pad devices 77 that are connected to fusible links 73. In the preferred embodiment, these five resistors can be used to create about 32 different voltages ranging from −9 volts to about −2 volts but other ranges and voltages could be created in other embodiments. Two more resistors R6-7 are also provided that are always used to create a bias voltage. Resistor R7 is connected by a pad 79 to a reference voltage that in the preferred embodiment is −9 volts. Resistor R6 is connected to the other ends of the fusible links by a pad at a ground voltage and conductive routing 75. In the preferred embodiment the values of the resistors is as follows: R1=75 ohms, R2=150 ohms, R3=300 ohms, R4=600 ohms, R5=1200 ohms, R6=75 ohms and R7=80 ohms. Of course, in other embodiments the resistors can have different values and there may be fewer or more resistors used to implement the FRAP 70.

At the time of wafer testing the bias voltage of the RF PA 1 is measured while it being applied to the RF PA circuits themselves. Next, a determination is made as to how much the bias voltage needs to be changed so that the RF PA 1 is biased to proper value. A calculation is performed to determine which of the five resistors R1-5 connected to the fusible links 73 need to be used to create the proper bias voltage. Once that is determined, the fusible links 73 connected to just the unneeded resistors are broken so that just the required resistors participate in creating the proper bias voltage. After the proper voltage is created, it is then connected to the reset of the other circuits in the RF PA1 to properly bias them. In the preferred embodiment, the FRAP is a voltage divider circuit formed by resisters R1-R5. The fusible links 73 can be broken on the silicon wafer 71 by any method as understood by those of ordinary skill in the art. For example, one way they can be broken is applying a strong enough voltage across them to create the breakage.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 5:
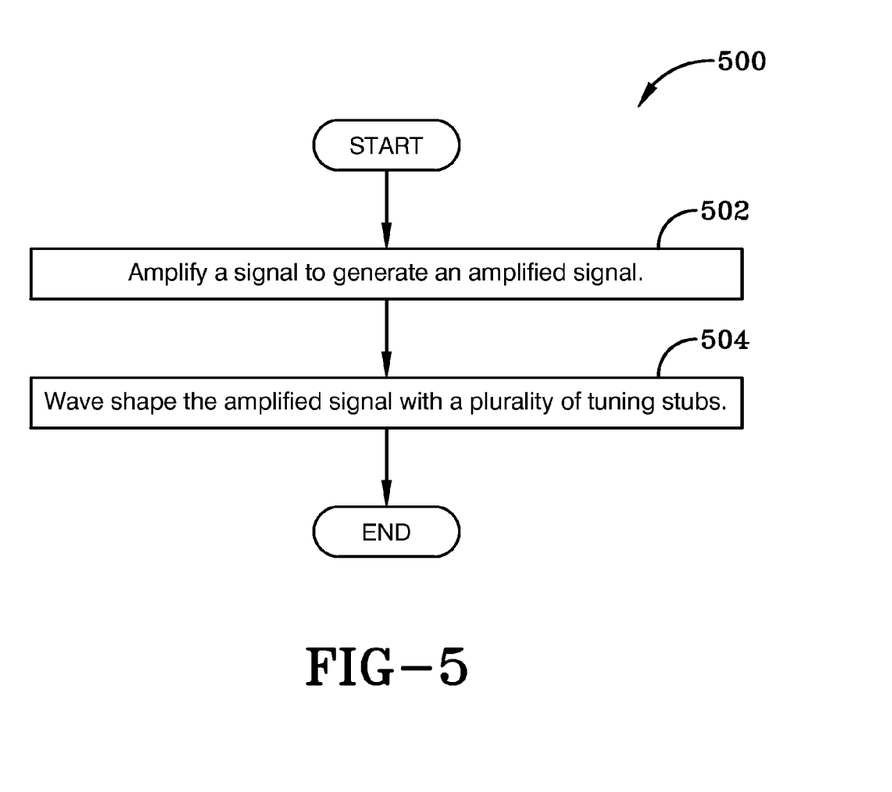
FIG. 5 illustrates an embodiment of a method for amplifying a signal with a Class F/Inverse Class F PA.

FIG. 5 illustrates a method 500 of Class F/Inverse Class F wideband amplification. The method 500 begins by amplifying a signal, at 502, to generate an amplified signal. The signal can be amplified by a dual stage amplifier or in another way as understood by one of ordinary skill in the art. The amplified signal is wave shaped, at 504, with a plurality of tuning stubs to generate an output signal. This can be accomplished with tuning stubs as discussed above and will not be entirely repeated here. In particular, the tuning stubs operate at different harmonics of the amplified signal. When operating in a Class F mode the plurality of tuning stubs act as short circuits at even harmonics and the plurality of tuning stubs act as open circuits at odd harmonics. When operating in an Inverse Class F mode the plurality of tuning stubs act as open circuits and at even harmonics the plurality of tuning stubs act as short circuits at odd harmonics.

The related and co-owned U.S. Applications entitled "TILE ARRAY PA MODULE USING QUADRATURE BALANCED PA MMICS," "DIGITALLY CONTROLLED POWER AMPLIFIER," and "CASCODE POWER AMPLIFIER," which are filed contemporaneously herewith, are incorporated as if fully rewritten.

In the foregoing description, certain terms have been used for brevity, clearness, and understanding. No unnecessary limitations are to be implied therefrom beyond the requirement of the prior art because such terms are used for descriptive purposes and are intended to be broadly construed. Therefore, the invention is not limited to the specific details, the representative embodiments, and illustrative examples shown and described. Thus, this application is intended to embrace alterations, modifications, and variations that fall within the scope of the appended claims.

Moreover, the description and illustration of the invention is an example and the invention is not limited to the exact details shown or described. References to "the preferred embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in the preferred embodiment" does not necessarily refer to the same embodiment, though it may.

What is claimed is:

1. A wideband radio frequency (RF) power amplifier (PA) comprising:
   an amplifier configured to amplify a radio frequency signal to generate an amplified RF signal with a fundamental frequency;
   an output matching network configured to wave shape the amplified radio signal over a least an octave of bandwidth to create a wave shaped RF output, wherein the output matching network further comprises:
   a first tuning stub configured to tune the amplified RF output at the second harmonic of the fundamental frequency, the first tuning stub including a conductive meandering first line;
   a second tuning stub configured to tune the amplified RF output at the third harmonic of the fundamental frequency, the second tuning stub including a conductive meandering second line;
   a third tuning stub configured to tune the amplified RF output at the fourth harmonic of the fundamental frequency, the third tuning stub including a conductive meandering third line; and
   a fourth tuning stub configured to tune the amplified RF output at the fifth harmonic of the fundamental frequency, the fourth tuning stub including a conductive meandering fourth line.

2. The wideband RF PA of claim 1, wherein the first line is a first line of metal, the second line is a second line of metal, the third line is a third line of metal, and the fourth line is a fourth line of metal.

3. The wideband RF PA of claim 1 further comprising:
   a GaN MMIC, wherein the conductive meandering first line is on the GaN MMIC, wherein the conductive meandering second line is on the GaN MMIC, wherein the conductive meandering third line is on the GaN MMIC, and wherein the conductive meandering fourth line is on the GaN MMIC.

4. The wideband RF PA of claim 3 wherein the silicon wafer is rectangular in shape and is smaller than 3 millimeters by 5.1 millimeters.

5. The wideband RF PA of claim 1, wherein the wideband RF PA is implemented on a planar structure that is rectangular in shape with a top edge, a bottom edge that is parallel to the top edge, a left edge, and a right edge that is parallel to the left edge and wherein the conductive meandering third line further comprises:
   at least two horizontal conductive line segments that are parallel to each other and the top edge and at least two conductive line segments that are parallel with each other and the right edge.

6. The wideband RF PA of claim 1, wherein the wideband RF PA is configured to operate as a Class F amplifier and an Inverse Class F amplifier; wherein when operating as a Class F amplifier the first tuning stub appears as a short circuit at the second Class F harmonic, the second tuning stub appears as an open circuit at the third Class F harmonic, the third tuning stub appears as a short circuit at the fourth Class F harmonic, the fourth tuning stub appears as an open circuit at the fifth Class F harmonic; and wherein when operating as an Inverse Class F amplifier the first tuning stub appears as an open circuit at the second Inverse Class F harmonic, the second tuning stub appears as an short circuit at the third Inverse Class F harmonic, the third tuning stub appears as an open circuit at the fourth Inverse Class F harmonic, the fourth tuning stub appears as an short circuit at the fifth Inverse Class F harmonic.

7. The wideband RF PA of claim 1, wherein the conductive meandering first line originates at an output of a transistor of the amplifier.

8. The wideband RF PA of claim 5 wherein the conductive meandering first line further comprises:
   a first line segment that originates at a transistor and is projected at about 45 degrees downward toward the bottom edge and the left edge, a second line segment extending downward from the first line segment and being parallel to the left edge, a third line segment extending rightward of the a bottom end of the second line segment and being parallel to the bottom edge, a fourth line segment that forms a short downward jog at a right end of the third line segment and being parallel with the left edge, a fifth line segment extending rightward from a bottom edge of the fourth line segment and being parallel to the bottom edge, a sixth line segment that forms a short upward jog from a right end of the fourth line segment and is being parallel with the left edge, a seventh line segment that extends rightward from a top end of the fifth line segment being parallel to the bottom edge and terminates in a first capacitor, wherein the conductive meandering second line further comprises:
   a first line segment of the meandering second line extending upward from a from a transmission line terminating in a second capacitor and being parallel with the left edge, an second line segment of the meandering second line extending leftward from a top end of the first line segment of the meandering second line and being parallel to the bottom edge, a third line segment of the meandering second line extending upward from a right end of the second line segment of the meandering second line and being parallel with the left edge, a fourth line segment of the meandering second line extending leftward from a top end of the third line segment of the meandering second line and being parallel to the bottom edge, and wherein the meandering third line further comprises:
a first line segment of the meandering third line that extends rightward from the second capacitor and being parallel with the bottom edge, a second line segment of the meandering third line extending upward from a right end of the first line segment of the meandering third line and being parallel with the right edge, a third line segment of the meandering third line extending leftward out from a top end of second line segment of the meandering third line and being parallel with the bottom edge, a fourth line segment of the meandering third line extending downward from a left end of third line segment of the meandering third line and being parallel with the right edge a fifth line segment of the meandering third line extending leftward out from a bottom end of the fourth line segment of the meandering third line and being parallel with the bottom edge, a sixth line segment of the meandering third line extending upward from a left end of the fifth line segment of the meandering third line and being parallel with the right edge, a seventh line segment of the meandering third line extending leftward from a top end of the sixth line segment of the meandering third line and being parallel to the bottom edge, an eight line segment of the meandering third line extending downward from seventh line segment and parallel to the right edge, a ninth line segment of the meandering third line extending rightward from a bottom end of the eighth line segment of the meandering third line and being parallel to the bottom, wherein the meandering fourth line further comprises:
a first line segment of the meandering fourth line extending upward from a transmission line terminated in a third capacitor and being parallel with the right edge, a second line segment of the meandering fourth line extending leftward from a top end of first line segment of the meandering fourth line and being parallel with the bottom edge.

9. The wideband RF PA of claim 8 wherein the meandering first line, the meandering second line, the meandering third line and the meandering fourth line are spaced apart so as to be shielded from each other and avoid interference with each other.

10. The wideband RF PA of claim 1 wherein the amplifier is a first amplifier and the output matching network is a first output matching network and further comprising:
a second amplifier that is a mirrored copy of the first amplifier; and
a second output matching network that is a mirrored copy of the first output matching network, wherein the first amplifier, the second amplifier, the first output matching network and the second output matching network operate in parallel to amplify the radio frequency signal and to wave shape the amplified radio signal.

11. The wideband RF PA of claim 1 further comprising:
an input stage Lange coupler, and
an output stage Lange coupler.

12. The wideband RF PA of claim 1 wherein a width of the first tuning stub is less than a width of the second tuning stub.

13. The wideband RF PA of claim 1 wherein the wideband RF PA is implemented as a Monolithic Microwave Integrated Circuit (MMIC).

14. The wideband RF PA of claim 1 wherein the integrated semiconductor is formed with gallium nitrate (GaN).

15. A Class F/Inverse Class F PA comprising:
an amplifier configured to amplify a radio wave signal to produce an amplified signal;
an output matching network to wave shape the amplified signal comprising a plurality of tuning stubs to generate an output signal, wherein the tuning stubs operate at different harmonics of the amplified signal, wherein when operating in a Class F mode the plurality of tuning stubs act as short circuits at even harmonics and the plurality of tuning stubs act as open circuits at odd harmonics, and wherein when operating in an Inverse Class F mode the plurality of tuning stubs act as open circuits at even harmonics and the plurality of tuning stubs act as short circuits at odd harmonics; and
wherein there are at least four different stubs each having a different meandering conductive line.

16. The Class F/Inverse Class F PA of claim 15 wherein the output matching network further comprises:
at least four different stubs configured to operate at different consecutive harmonics of the amplified signal to generate the output signal.

17. The Class F/Inverse Class F PA of claim 15 wherein the amplifier is a two-stage amplifier.

* * * * *